United States Patent
Wei et al.

(10) Patent No.: US 6,621,678 B2
(45) Date of Patent: Sep. 16, 2003

(54) THERMAL PROTECTION CIRCUIT AND METHOD FOR PROTECTING POWER DELIVERY CIRCUIT

(75) Inventors: Dah-Jiun Wei, Hsinchu (TW); Ming-Nan Chuang, Hsinchu (TW)

(73) Assignee: Analog Integrations Co., Ltd., Hsinchu (TW)

( * ) Notice: Subject to any disclaimer, the term of this patent is extended or adjusted under 35 U.S.C. 154(b) by 102 days.

(21) Appl. No.: 10/038,592

(22) Filed: Jan. 3, 2002

(65) Prior Publication Data

US 2002/0097541 A1 Jul. 25, 2002

(51) Int. Cl.[7] .............................. H02H 5/00; H02H 5/04
(52) U.S. Cl. ......................... 361/103; 363/106; 363/58
(58) Field of Search .................................. 361/103, 106, 361/58

(56) References Cited

U.S. PATENT DOCUMENTS

| | | | | |
|---|---|---|---|---|
| 3,868,554 A | * | 2/1975 | Konrad | 318/434 |
| 4,458,284 A | * | 7/1984 | Otala | 361/79 |
| 4,800,331 A | * | 1/1989 | Vesce et al. | 323/277 |
| 5,550,702 A | * | 8/1996 | Schmidt et al. | 361/103 |
| 5,600,528 A | * | 2/1997 | McQueen | 361/103 |
| 6,051,933 A | * | 4/2000 | Aiello et al. | 315/209 R |

* cited by examiner

*Primary Examiner*—Bao Vu
(74) *Attorney, Agent, or Firm*—Volpe and Koenig, P.C.

(57) ABSTRACT

A thermal protection circuit arranged in an integrated circuit for protecting a power delivery is disclosed. The thermal protection circuit for protecting a power delivery circuit includes a first thermal sensing circuit exhibiting a negative temperature coefficient characteristic for sensing a temperature of the power delivery circuit and providing a first voltage, a second thermal sensing circuit exhibiting a positive temperature coefficient characteristic for transforming the temperature of the power delivery circuit to a second voltage, an amplifier electrically connected to the first voltage and the second voltage for providing a control signal, wherein the amplifier is a function of a voltage difference between the first voltage and the second voltage, and a switch electrically connected to an output of the amplifier for limiting a maximum current passing there through in response to the control signal.

16 Claims, 4 Drawing Sheets

US 6,621,678 B2

THERMAL PROTECTION CIRCUIT AND METHOD FOR PROTECTING POWER DELIVERY CIRCUIT

FIELD OF THE INVENTION

The present invention relates to a thermal protection circuit and a method for protecting a power delivery circuit, and especially to a thermal protection circuit arranged in an integrated circuit for protecting the power delivery circuit.

BACKGROUND OF THE INVENTION

Thermal protection is an important requirement for a power delivery circuit to prevent permanent damage due to prolonged operation at excessive temperatures. The maximum operation temperature of the power delivery circuit is limited by a thermal shutdown circuit which provides a necessary protection by sensing a temperature of the power delivery circuit and automatically shutting down the power delivery circuit when the temperature of the circuit exceeds a predictable threshold value.

Normally, a base-emitter voltage $V_{BE}$ of a transistor which is a function of temperature is used as a temperature-sensing element. The base-emitter voltage $V_{BE}$ of the transistor used for this purpose typically operates at forward conduction. However, the base-emitter voltage $V_{BE}$ with a negative temperature coefficient of voltage ($T_C=-2\,mV/^\circ C.$) decreases as the temperature of the power delivery circuit increases. When the temperature of the circuit rises, the base-emitter voltage $V_{BE}$ will decrease until the temperature of the circuit reaches a threshold value, thereby causing the thermal shutdown circuit to shut down the power delivery circuit. The power delivery circuit may oscillate by turning itself on and off through the thermal shutdown circuit. Therefore, a hysteresis protection circuit is applied to the power delivery circuit in order to reduce thermal oscillations at a shutdown temperature.

FIG. 1 shows a current waveform of a power delivery circuit with a hysteresis protection circuit arranged in an integrated circuit according to the prior art. Please refer to FIG. 1. It shows the current waveform of a general power delivery circuit with the hysteresis protection circuit. When the power delivery circuit sustains an excessive loading current, the current waveform (where an unusual condition occurs), which is out of specification, is like a curve 101. Thereby, the power delivery circuit is turned off by the hysteresis protection circuit, and the current waveform is like a curve 102. Because the power delivery circuit is turned off, the temperature of the power delivery circuit is decreasing into a threshold value, thereby the power delivery circuit being turned on again. Moreover, the current which passes through the integrated circuit with a constant value (where the current waveform is like a curve 103) might increase the temperature of the integrated circuit. And then, the temperature of the integrated circuit will reach the threshold value to turn off the power delivery circuit again. Although the hysteresis protection circuit is designed in the power delivery circuit, the thermal oscillation can not be avoided (where the current waveform is like a curve 104). When the power delivery circuit is turned off with the constant current, the integrated circuit will be oscillated in the designed hysteresis temperature region, which is called thermal oscillation. The ICs design needs to avoid this because the different coefficient of thermal expansion might cause crack between package and die.

It is therefore attempted by the applicant to deal with the above situation encountered by the prior art.

SUMMARY OF THE INVENTION

It is therefore an object of the present invention to propose a thermal protection circuit for protecting a power delivery circuit to limit a maximum current passing through the power delivery circuit by using a thermal feedback servo loop to adjust the conductive resistance of the power delivery circuit.

It is therefore another object of the present invention to propose a thermal protection circuit for protecting a power delivery circuit to limit a maximum current passing through the power delivery circuit by using a pulse width modulation technique which is a function of the temperature of the power delivery circuit.

It is therefore another object of the present invention to propose a method for protecting a power delivery circuit to limit a maximum current passing through the power delivery circuit by using a thermal feedback servo loop to adjust the conductive resistance of the power delivery circuit.

It is therefore an additional object of the present invention to propose a method for protecting a power delivery circuit to limit a maximum current passing through the power delivery circuit by using a pulse width modulation technique which is a function of the temperature of the power delivery circuit.

The thermal protection circuit for protecting a power delivery circuit includes a first thermal sensing circuit exhibiting a negative temperature coefficient characteristic for sensing a temperature at the power delivery circuit and providing a first voltage, a second thermal sensing circuit exhibiting a positive temperature coefficient characteristic for transforming the temperature of the power delivery circuit to a second voltage, an amplifier electrically connected to the first voltage and the second voltage for providing a control signal, wherein the amplifier is a function of a voltage difference between the first voltage and the second voltage, and a switch electrically connected to an output of the amplifier for limiting a maximum current passing there through in response to the control signal.

According to an aspect of the present invention, the first thermal sensing circuit includes a current source, and a transistor having an emitter terminal grounded, a collector terminal electrically connected to the current source, and a base terminal electrically connected to the collector for providing a base-emitter voltage of the transistor as the first voltage.

Preferably, the transistor is a bipolar transistor (BJT).

Preferably, the amplifier is an operational amplifier (OP amplifier).

Preferably, the thermal protection circuit further includes a load electrically connected to the switch.

Preferably, the load is a passive load.

Preferably, the load is an active load.

Preferably, the second thermal sensing circuit includes a third voltage proportional to an absolute temperature of the ambient temperature, a thermal circuit having a thermal resistance for transforming the temperature at the power delivery circuit to a fourth voltage, and an adder electrically connected to the third voltage and the fourth voltage for providing the second voltage that is a sum of the third voltage and the fourth voltage.

It is therefore another object of the present invention to propose a thermal protection circuit for protecting a power delivery circuit, including an amplifier electrically connected to a reference voltage and a first voltage that is a function of a temperature on the power delivery circuit for providing a second voltage by a difference of the reference voltage and the first voltage, a comparator electrically connected to the second voltage and a sawtooth waveform voltage for comparing the second voltage and the sawtooth waveform voltage to generate a pulse width modulation signal, and a switch electrically connected to an output of the comparator for limiting a maximum current passing there through in response to the pulse width modulation signal.

Preferably, the amplifier is an operational amplifier (OP amplifier).

Preferably, the thermal protection circuit further includes a load electrically connected to the switch.

Preferably, the load is a passive load.

Preferably, the load is an active load.

It is therefore another object of the present invention to propose a method for protecting a power delivery circuit which includes a first thermal sensing circuit, and a second thermal sensing circuit, including the steps of: (a) sensing a temperature at the power delivery circuit and providing a first voltage that decreases when the temperature rises by the first thermal sensing circuit, (b) transforming the temperature of the power delivery circuit to a second voltage that increases when the temperature rises by the second thermal sensing circuit, and (c) providing a control signal by comparing the first voltage and the second voltage, thereby the control signal capable of limiting a maximum current passing through the power delivery circuit.

Preferably, the step of transforming the temperature of the power delivery circuit to a second voltage that increases when the temperature rises, includes the steps of: (a) sensing an ambient temperature and providing a third voltage proportional to an absolute temperature of the ambient temperature, (b) transforming the temperature of the power delivery circuit to a fourth voltage by a thermal resistance, and (c) providing the second voltage which is a sum of the third voltage and the fourth voltage.

It is therefore an additional object of the present invention to propose a method for protecting a power delivery circuit, including the steps of: (a) providing a second voltage by a difference of a reference voltage and a first voltage that is a function of a temperature at the power delivery circuit, (b) generating a pulse width modulation signal by comparing the second voltage and a sawtooth waveform voltage, and (c) limiting a maximum current passing through the integrated circuit in response to the pulse width modulation signal.

The present invention may best be understood through the following description with reference to the accompanying drawings, in which:

DETAILED DESCRIPTION OF THE PREFERRED EMBODIMENT

Figure 2:
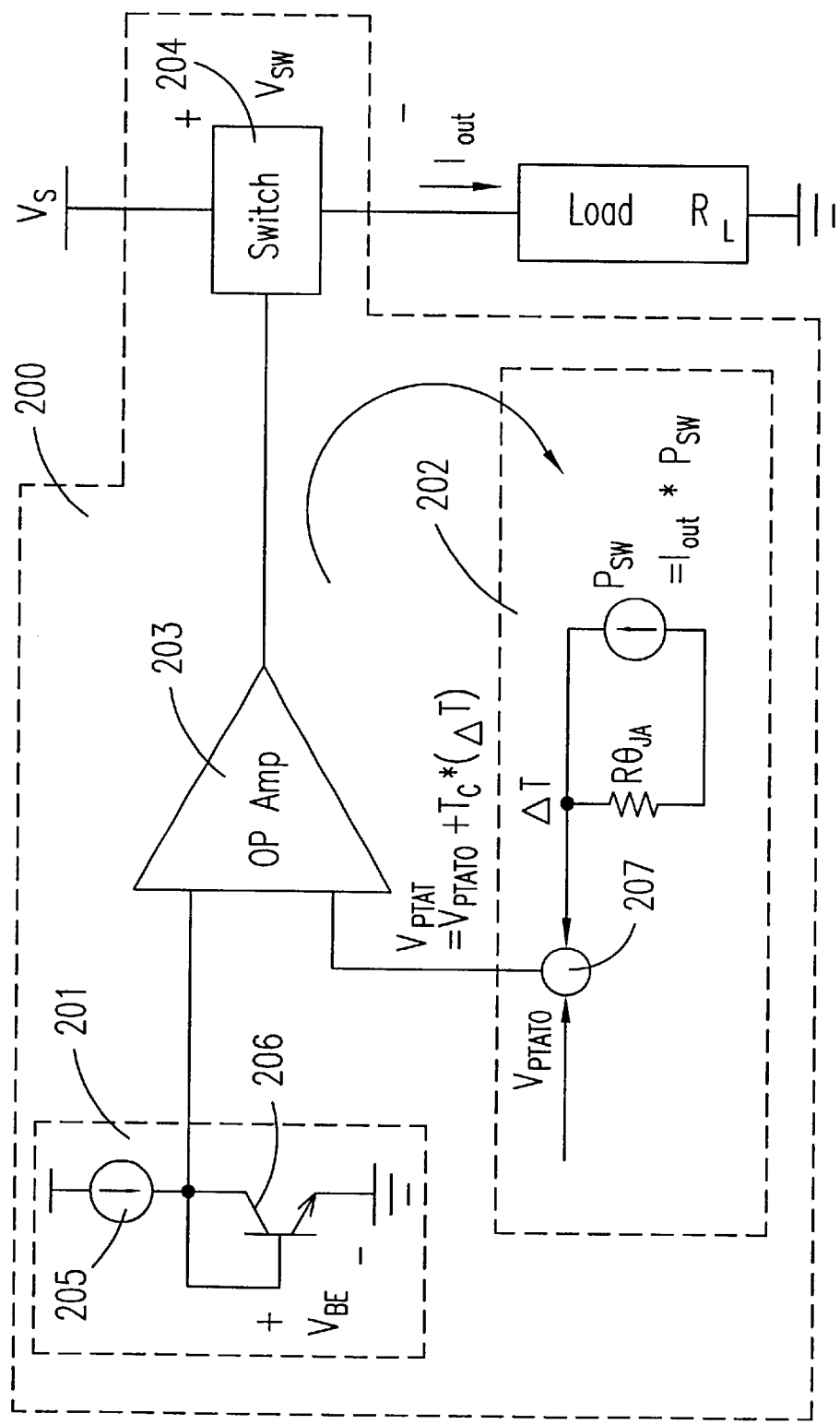
FIG. 2 is a schematic diagram illustrating a thermal protection circuit arranged in an integrated circuit for protecting a power delivery circuit according to a first preferred embodiment of the present invention.

FIG. 2 is a schematic diagram illustrating a thermal protection circuit arranged in an integrated circuit for protecting a power delivery circuit according to the first preferred embodiment of the present invention. As shown in FIG. 2, the thermal protection circuit arranged in an integrated circuit 200 for protecting the power delivery circuit includes a first thermal sensing circuit 201, a second thermal sensing circuit 202, an amplifier 203 and a switch 204. The first thermal sensing circuit 201 exhibits a negative temperature coefficient characteristic for sensing a temperature on the power delivery circuit of an integrated circuit 200 and provides a first voltage. The second thermal sensing circuit 202 exhibits a positive temperature coefficient characteristic for transforming the temperature on the power delivery circuit of the integrated circuit 200 to a second voltage $V_{PTAT}$. The amplifier 203 is electrically connected to the first voltage and the second voltage $V_{PTAT}$ for providing a control signal, wherein the amplifier 203 is a function of a voltage difference between the first voltage and the second voltage $V_{PTAT}$. In addition, the switch 204 is electrically connected to an output of the amplifier 203 for limiting a maximum current passing there through in response to the control signal.

However, the first thermal sensing circuit 201 includes a current source 205, and a transistor 206. The transistor 206 is a NPN type transistor. The transistor 206 has an emitter terminal grounded, a collector terminal electrically connected to the current source 205, and a base terminal electrically connected to the collector for providing a base-emitter voltage $V_{BE}$ of the transistor 206 as the first voltage. Meanwhile, the transistor 206 can also be a PNP type transistor. Therefore, the connection configuration of the first thermal sensing circuit 201 is different. The transistor 201 can be a bipolar transistor (BJT) or a metal oxide semiconductor. The amplifier 203 can be an operational amplifier (OP amplifier).

Furthermore, the thermal protection circuit for protecting a power delivery circuit of the integrated circuit further includes a load $R_L$ electrically connected to the switch 204. The load $R_L$ can be a passive load or an active load.

The second thermal sensing circuit 202 in proportion to the power dissipation includes a third voltage $V_{PTAT0}$, a thermal circuit, and an adder 207. The third voltage $V_{PTAT0}$ is proportional to an absolute temperature of the ambient temperature. The thermal circuit has a thermal resistance $R\theta_{JA}$ for transforming the temperature on the power delivery circuit of the integrated circuit 200 to a fourth voltage $T_C \times (\Delta T)$, wherein $T_c$ is a temperature coefficient of voltage, and $\Delta T$ is a variation of the temperature on the integrated circuit 200. In addition, the adder 207 is electrically connected to the third voltage $V_{PTAT0}$ and the fourth voltage $T_C \times (\Delta T)$ for providing the second voltage $V_{PTAT}$ that is a sum of the third voltage $V_{PTAT0}$ and the fourth voltage $T_C \times (\Delta T)$.

When the switch 204 is passed through by an excessive current, it may induce an equivalent power dissipation $P_{SW}$ and the temperature on the integrated circuit 200. Equation (1) shows the power dissipation on the IC, wherein $V_{SW}$ is the voltage across the switch 204, $I_{OUT}$ is an output current, and $V_S$ is a supply voltage.

$$P_{SW} = I_{OUT} \times V_{SW} = I_{OUT} \times (V_S - I_{OUT} \times R_L) \quad (1)$$

The maximum power dissipation threshold $P_{sw-max}$ is shown as equation (2), where $T_{Jmax}$ is a maximum allowable junction temperature, $T_A$ is an ambient temperature, and $R\theta_{JA}$° C./W is the thermal resistance between the junction and the ambient that is different with package types. If the small outline package is used, the thermal resistance $R\theta_{JA}$ is about 150° C./W.

$$P_{SW\_max} = \frac{T_{Jmax} - T_A}{R\theta_{JA}} \qquad (2)$$

Because the base-emitter voltage $V_{BE}$ of the transistor 206 and the second voltage $V_{PTAT}$ are the inputs of the amplifier 203, the conductive resistance of the switch 204 is controlled by a thermal limiting servo loop (the first thermal sensing circuit 201, the second thermal sensing circuit 202, and the amplifier 203). When the temperature is increasing, the base-emitter voltage $V_{BE}$ and the second voltage $V_{PTAT}$ are going to equal, thereby driving the amplifier to linear region, which can adjust a conductive resistance of the switch 204. According to equations (1) and (2), the output current $I_{OUT}$ is limited by the thermal limiting servo loop. Finally, the equation of the output current $I_{OUT}$ is related to the load $R_L$ as shown below.

$$I_{OUT} = \frac{1}{2} \times \left[ \frac{V_S}{R_L} - \sqrt{\left(\frac{V_S}{R_L}\right)^2 - \frac{4 \times (T_{Jmax} - T_A)}{R_L \times R\theta_{JA}}} \right] \qquad (3)$$

Therefore, the thermal protection circuit provides a ORM (on resistance modulation) method to adjust the conductive resistance of the switch 204 in order to limit the output current $I_{OUT}$.

Figure 3:
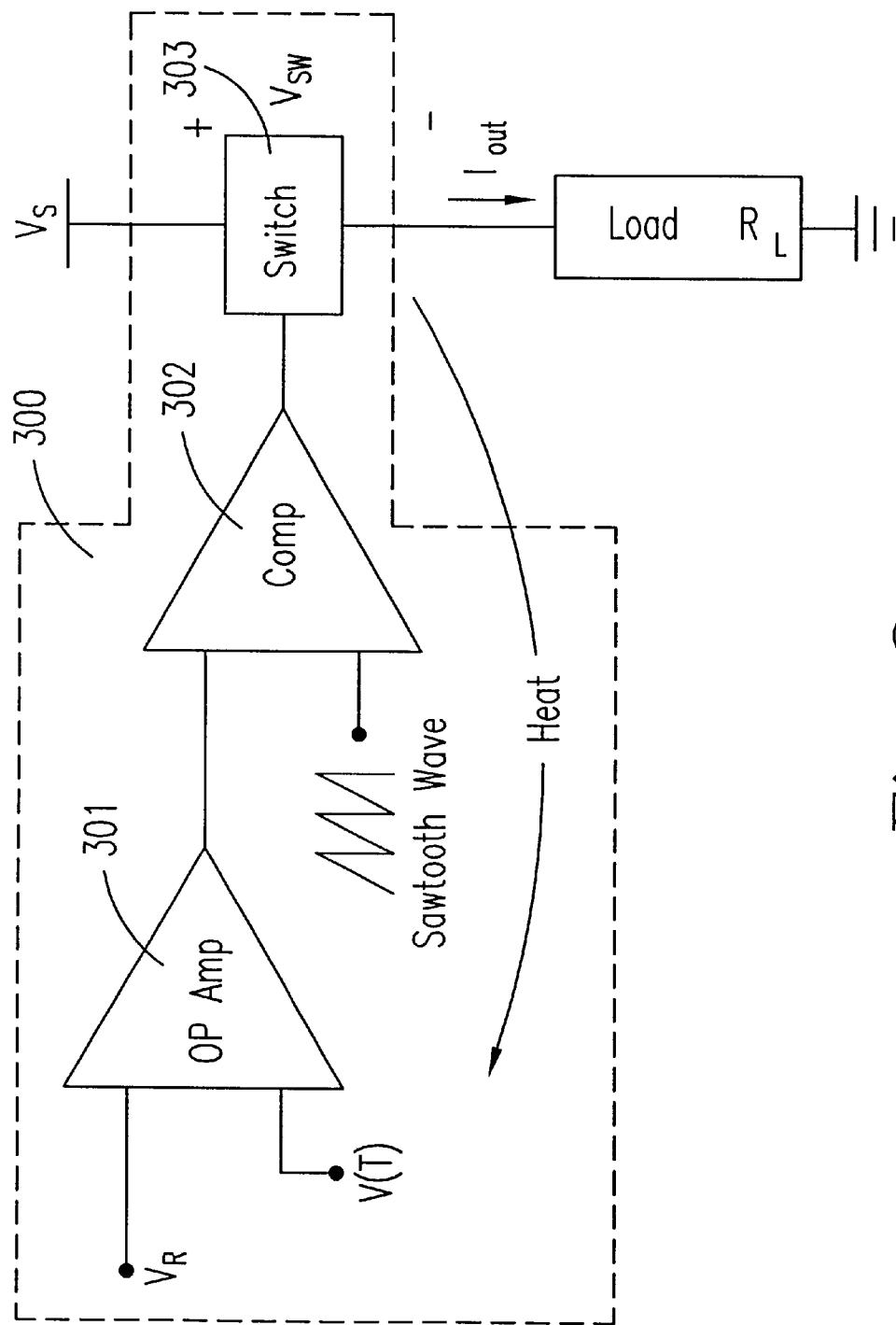
FIG. 3 is a schematic diagram illustrating a thermal protection circuit arranged in an integrated circuit for protecting a power delivery circuit according to a second preferred embodiment of the present invention.

FIG. 3 is a schematic diagram illustrating a thermal protection circuit arranged in an integrated circuit for protecting a power delivery circuit according to the second preferred embodiment of the present invention. As shown in FIG. 3, a protection circuit arranged in an integrated circuit 300 for protecting a power delivery circuit includes an amplifier 301, a comparator 302, and a switch 303. The amplifier 301 is electrically connected to a reference voltage $V_R$ and a first voltage V(T) that is a function of temperature on the power delivery circuit of an integrated circuit 300 for providing a second voltage by a difference of the reference voltage $V_R$ and the first voltage V(T). The comparator 320 is electrically connected to the second voltage and a sawtooth waveform voltage for comparing the second voltage and the sawtooth waveform voltage to generate a pulse width modulation signal. In addition, the switch 303 is electrically connected to an output of the comparator 302 for limiting a maximum current passing there through in response to the pulse width modulation signal. Meanwhile, the amplifier 301 can be an operational amplifier (OP amplifier).

Furthermore, the thermal protection circuit for protecting a power delivery circuit of the integrated circuit further includes a load $R_L$ electrically connected to the switch 303. Meanwhile, the load $R_L$ can be a passive load or an active load.

Figure 1:
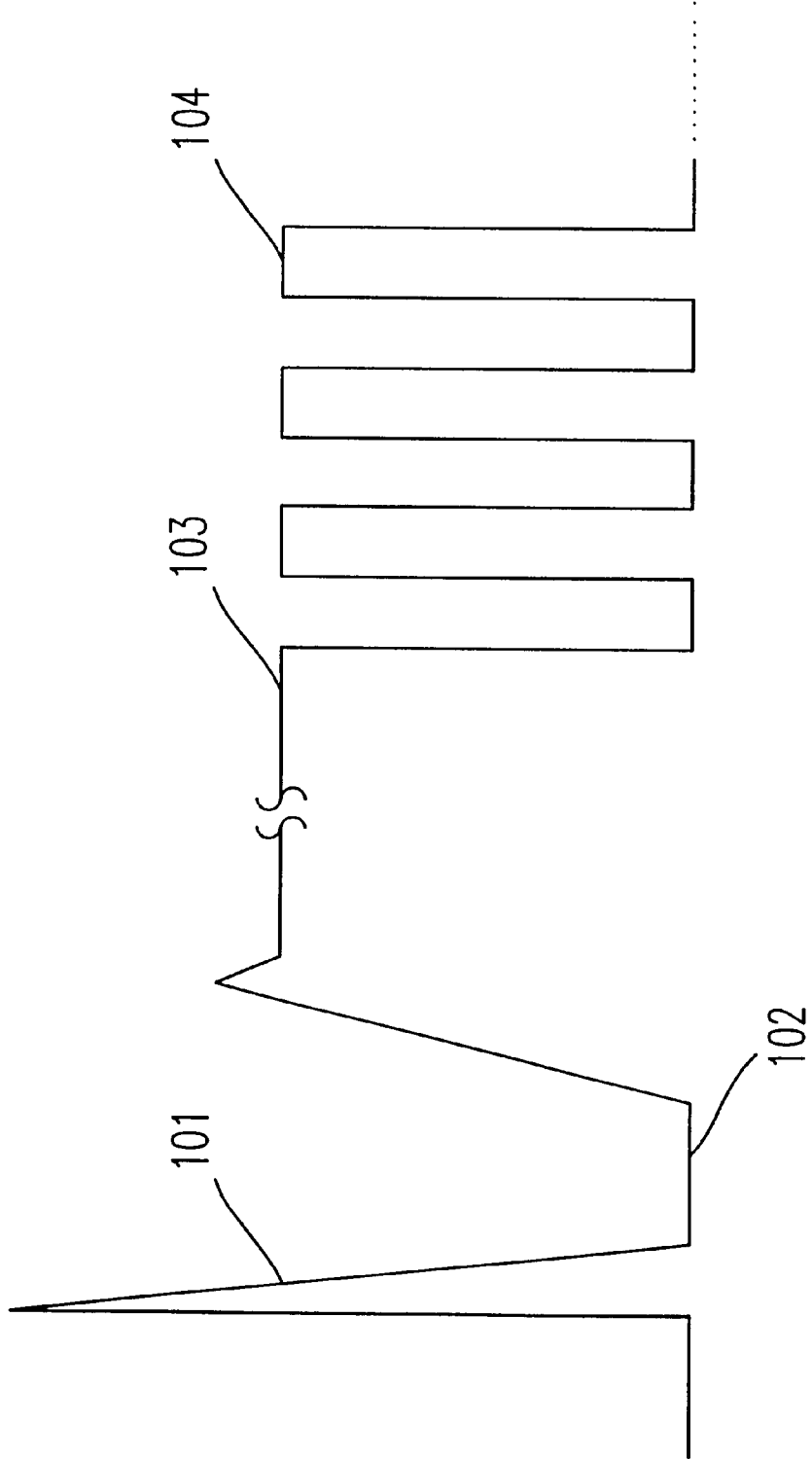
FIG. 1 illustrates a current waveform of a power delivery circuit with a hysteresis protection circuit according to the prior art.
Figure 4:
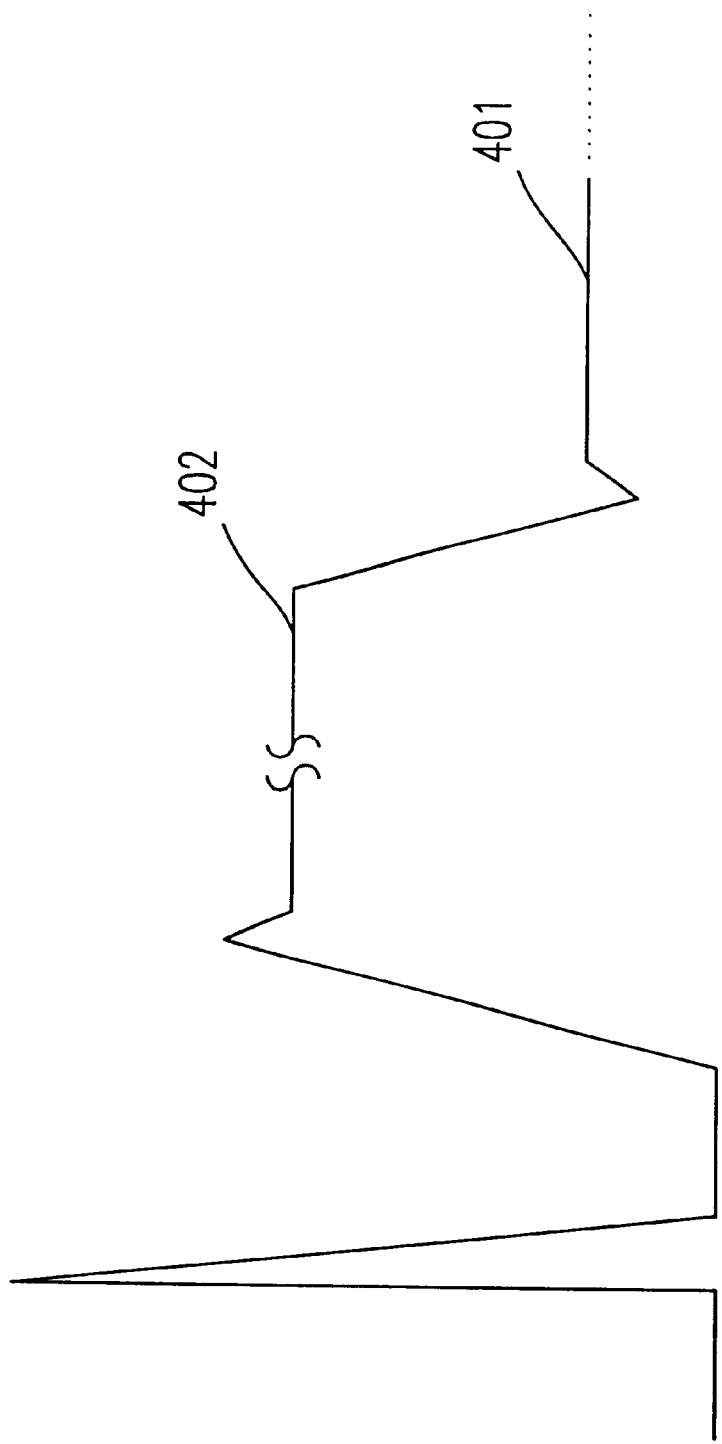
FIG. 4 is illustrates a current waveform of a power delivery circuit with a thermal protection circuit according to a preferred embodiment of the present invention.

FIG. 4 is a current waveform of a power delivery circuit with a thermal protection circuit according to the preferred embodiment of the present invention. As shown in FIG. 4, the significant difference with FIG. 1 is to avoid the thermal oscillation. The curve 401 is the steady state current different from curve 402. The decreased current also decreases the temperature of the power delivery circuit to a threshold value. Therefore, the invention can avoid the thermal oscillation on a general high-power delivery circuit.

Table 1 is the useful parameters. It points out that a 1-ohm load $R_L$ is added to the invention, and the output current $I_{OUT}$ is stable at 0.165 ampere. The maximum power dissipation $P_{SW\_max}$ is limited to 0.8 watt so that the ICs will not be damaged while the temperature is rising.

TABLE 1

| parameter | | value |
|---|---|---|
| Supply voltage | $V_S$ | 5 V |
| Load | $R_L$ | 1 Ω |
| Temperature threshold | $T_{Jmax}$ | 145° C. |
| Room temperature | $T_A$ | 25° C. |
| Thermal resistance | $R\theta_{JA}$ | 150° C./W |
| Steady state output current | $I_{OUT}$ | 0.165 A |
| Maximum power limiting | $P_{SW\_max}$ | 0.8 W |

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A thermal protection circuit for protecting a power delivery circuit, comprising:
    a first thermal sensing circuit exhibiting a negative temperature coefficient characteristic for sensing a temperature of said power delivery circuit and providing a first voltage;
    a second thermal sensing circuit exhibiting a positive temperature coefficient characteristic for transforming said temperature of said power delivery circuit to a second voltage;
    an amplifier electrically connected to said first voltage and said second voltage for providing a control signal, wherein said amplifier is a function of a voltage difference between said first voltage and said second voltage; and
    a switch electrically connected to an output of said amplifier for limiting a maximum current passing there through in response to said control signal.

2. The thermal protection circuit according to claim 1, wherein said first thermal sensing circuit comprises:
    a current source; and
    a transistor having an emitter terminal grounded, a collector terminal electrically connected to said current source, and a base terminal electrically connected to said collector for providing a base-emitter voltage of said transistor as said first voltage.

3. The thermal protection circuit according to claim 2, wherein said transistor is a bipolar transistor(BJT).

4. The thermal protection circuit according to claim 1, wherein said amplifier is an operational amplifier (OP amplifier).

5. The thermal protection circuit according to claim 1, wherein said thermal protection circuit further comprises a load electrically connected to said switch.

6. The thermal protection circuit according to claim 5, wherein said load is a passive load.

7. The thermal protection circuit according to claim 5, wherein said load is an active load.

8. The thermal protection circuit according to claim 1, wherein said second thermal sensing circuit comprises:
    a third voltage proportional to an absolute temperature of said ambient temperature;

a thermal circuit having a thermal resistance for transforming said temperature of said power delivery circuit to a fourth voltage; and an adder electrically connected to said third voltage and said fourth voltage for providing said second voltage that is a sum of said third voltage and said fourth voltage.

9. A protection circuit for protecting a power delivery circuit, comprising:

an amplifier electrically connected to a reference voltage and a first voltage that is a function of a temperature on said power delivery circuit for providing a second voltage by a difference of said reference voltage and said first voltage;

a comparator electrically connected to said second voltage and a sawtooth waveform voltage for comparing said second voltage and said sawtooth waveform voltage to generate a pulse width modulation signal; and a switch electrically connected to an output of said comparator for limiting a maximum current passing therethrough in response to said pulse width modulation signal.

10. The thermal protection circuit according to claim 9, wherein said amplifier is an operational amplifier (OP amplifier).

11. The thermal protection circuit according to claim 9, wherein said thermal protection circuit further comprises a load is electrically connected to said switch.

12. The thermal protection circuit according to claim 11, wherein said load is a passive load.

13. The thermal protection circuit according to claim 11, wherein said load is an active load.

14. A method for protecting a power delivery circuit which comprises a first thermal sensing circuit, and a second thermal sensing circuit, comprising the steps of:

sensing a temperature of said power delivery circuit and providing a first voltage that decreases when said temperature rises by said first thermal sensing circuit;

transforming said temperature of said power delivery circuit to a second voltage that increases when said temperature rises by said second thermal sensing circuit;

providing a control signal by comparing said first voltage and said second voltage, thereby said control signal capable of limiting a maximum current passing through said power delivery circuit.

15. The method according to claim 14, wherein said step of transforming said temperature at said power delivery circuit to a second voltage that increases when said temperature rises, comprises the steps of:

sensing an ambient temperature and providing a third voltage proportional to an absolute temperature of said ambient temperature;

transforming said temperature of said power delivery circuit to a fourth voltage by a thermal resistance; and providing said second voltage which is a sum of said third voltage and said fourth voltage.

16. A method for protecting a power delivery circuit, comprising the steps of:

providing a second voltage by a difference of a reference voltage and a first voltage that is a function of a temperature on said power delivery circuit;

generating a pulse width modulation signal by comparing said second voltage and a sawtooth waveform voltage; and limiting a maximum current passing through said integrated circuit in response to said pulse width modulation signal.

* * * * *